United States Patent
Na

(10) Patent No.: US 7,450,218 B2
(45) Date of Patent: Nov. 11, 2008

(54) SEMICONDUCTOR MANUFACTURING SCANNER HAVING RETICLE MASKING DEVICE, AND EXPOSURE METHOD USING THE SAME

(75) Inventor: Young-Ho Na, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 235 days.

(21) Appl. No.: 11/437,683

(22) Filed: May 22, 2006

(65) Prior Publication Data
US 2006/0268252 A1 Nov. 30, 2006

(30) Foreign Application Priority Data
May 24, 2005 (KR) .................. 10-2005-0043415

(51) Int. Cl.
G03B 27/54 (2006.01)
G03B 27/42 (2006.01)
(52) U.S. Cl. .......................... 355/67; 355/53
(58) Field of Classification Search .............. 355/67, 355/53, 68, 69; 349/192
See application file for complete search history.

(56) References Cited

U.S. PATENT DOCUMENTS

| 4,864,360 A | 9/1989 | Isohata et al. |
| 6,576,378 B2 | 6/2003 | Kim |
| 6,743,555 B2 | 6/2004 | Jeong et al. |
| 2003/0035090 A1* | 2/2003 | Imai et al. ................ 355/53 |
| 2006/0181672 A1* | 8/2006 | Dong-Il ................... 349/192 |

* cited by examiner

*Primary Examiner*—Peter B Kim
(74) *Attorney, Agent, or Firm*—Volentine & Whitt, PLLC

(57) ABSTRACT

A scanner of photolithographic equipment has a reticle masking device capable of forming an aperture, in the shape of a slit, without inducing vibrations in the scanner. The reticle masking device forms the slit electronically, without the use of motive power, and can likewise vary the width of the slit in a direction parallel to the direction of movement of a reticle stage. In particular, the width of the slit is increase at the beginning and decreased at the end of a scan. Preferably, the reticle masking device is a liquid crystal display. It is thus possible to isolate and compensate for vibrations induced by the movement of the reticle stage or wafer stage during a scan, and thus to prevent flaws in the exposure process due to relative positional errors and thereby enhance the production yield.

11 Claims, 8 Drawing Sheets

SEMICONDUCTOR MANUFACTURING SCANNER HAVING RETICLE MASKING DEVICE, AND EXPOSURE METHOD USING THE SAME

BACKGROUND OF THE INVENTION

1. Field of the Invention

The present invention relates to photolithographic equipment for manufacturing semiconductor devices and the like. More particularly, the present invention relates to a scanner of photolithographic equipment, and to a method of scanning a substrate to transfer an image of a pattern to a photosensitive layer on the substrate.

2. Description of the Related Art

Currently, semiconductor devices are being remarkably improved to foster rapid developments in the telecommunications field as well as in information processing equipment such as computers. In such applications, semiconductor devices must operate at high speeds and have the ability to store large amounts of data. As such, the technology of manufacturing semiconductor devices is constantly being improved with an aim toward increasing the integration, reliability, and speed, etc., of the devices.

The manufacturing of semiconductor devices generally includes a deposition process for forming a layer to be patterned on a semiconductor wafer, a photolithography process for forming a mask on the layer to be patterned, an etch process for etching the layer using the mask to thereby pattern the layer, an ion implantation process for implanting dopant ions using the patterned layer as an ion implantation mask, and various heat treatment processes. Among these processes, photolithography is important in attaining the desired critical dimension of the patterned layer. Thus, photolithography is currently the subject of intensive research and development.

Specifically, photolithography is carried out to form and pattern a photosensitive layer, such as a photoresist layer, on the semiconductor wafer. To this end, the photolithography process entails coating the semiconductor wafer with a layer of photoresist, exposing the layer of photoresist, and developing the exposed photoresist. The semiconductor wafer is coated with the photoresist using a spin-coating apparatus and is exposed using an exposure apparatus. The exposure apparatus includes a light source for generating exposure light, such as UV light or X-rays, a reticle bearing an image to be picked up by the exposure light and transferred to the photoresist layer, optics for directing the exposure light through the reticle and projecting the resulting image of the reticle pattern onto the wafer on a reduced scale, and a wafer stage for supporting the wafer and aligning the wafer with the optics so that the image of the reticle pattern is projected onto a desired area of the wafer.

Exposure apparatus of this type includes a stepper in which an image of the reticle pattern is projected onto an entire die of the wafer (unit area of the photoresist layer) such that the die is exposed at once. The wafer stage is then moved (stepped) and the same image is then projected onto another die. The process is likewise repeated until all of the dies are exposed. An alternative to the stepper is a step and scan exposure apparatus (hereinafter, referred to as a "scanner").

In the scanner, the reticle and wafer are moved parallel to each other in opposite directions. At this time, the exposure light is directed onto the reticle through a rectangular slit. The width of the slit extends in the direction of movement of the reticle during a scan. On the other hand, the length of the slit extends transverse to the direction of movement of the reticle during a scan, and is similar to the diameter of the aperture of the optics of the scanner, e.g., the diameter of the entrance pupil of an objective lens of the optics. As a result, the reticle is illuminated with a rectangular beam of the exposure light. Also, the movement of the reticle causes the reticle and hence, the reticle pattern, to be scanned with the exposure light. Thus, for example, the reticle should be scanned at a speed four times as great as that at which the wafer is moved when the image of the reticle pattern is projected onto the wafer at a reduced scale of about one-fourth.

Furthermore, the width of the slit determines the dose of the exposure light that is incident on the reticle and projects the image of the reticle pattern onto the wafer. Therefore, the masking device of the conventional scanner includes reticle masking blades which are power-driven to produce a rectangular slit having desired dimensions. A conventional scanner including a reticle masking device having such power-driven reticle masking blades is disclosed in U.S. Pat. No. 6,348,303 issued on Feb. 19, 2002, and entitled "Lithographic Projection Apparatus."

In the scanner disclosed in this document, the reticle masking blades are power-driven by a stepping motor. The stepping motor is operated by a control signal output by a servo control. Therefore, such a conventional scanner produces vibrations, namely, the vibrations of the motor used to move the blades of the reticle masking device. The vibrations can propagate throughout the scanner and, for example, shake the reticle stage. As a result, the light incident on the reticle is not projected onto the wafer in a constant, uniform fashion. Accordingly, the vibrations cause defects to occur in the exposure process, which negatively impacts the yield of the manufacturing process.

SUMMARY OF THE INVENTION

Therefore, an object of the present invention is to provide a reticle masking device of a scanner that does not produce vibrations when the device forms an aperture and alters a dimension of the aperture.

It is another object of the present invention to provide a scanner of photolithographic equipment in which relative positional errors of a reticle stage and a wafer stage caused by vibrations can be easily and precisely determined so that such errors can be compensated for and the exposure process can be carried out flawlessly.

Likewise, it is still another object of the present invention to provide a scanning method of exposing a photosensitive layer on a substrate using a reticle wherein an aperture is formed for the reticle without producing vibrations.

In accordance with an aspect of the present invention, there is provided a scanner of lithographic equipment including a light source, a substrate stage movable horizontally in a scan direction, optics that guide light emitted by the light source to the substrate stage, a reticle stage movable horizontally in a scan direction parallel to the scan direction of movement of the substrate stage, and reticle masking means for forming a slit-shaped aperture electronically without the use of motive power in an optical path of the equipment extending between the light source and the reticle stage. Therefore, light having a sectional area corresponding to that of the aperture is incident on a reticle supported by the reticle stage. The reticle masking means is also capable of adjusting a dimension of the aperture electronically without the use of motive power. Accordingly, the reticle scanning means can form the aperture and adjust the dimensions of the aperture without inducing vibrations in the scanner.

According to another aspect of the invention, the reticle masking device is a liquid crystal display that can form the slit-shaped aperture and adjust the width of the aperture in a predetermined direction by means of externally applied electrical signals. The liquid crystal display may be a passive matrix LCD or an active matrix LCD. In either case, the liquid crystal display includes a liquid crystal panel and scan and data drivers operatively connected to the panel. The liquid crystal panel has opposing substrates on which scan and data lines extending orthogonal to each other are provided, and liquid crystals interposed between the substrates. The scan and data drivers output scan and data signals to the scan and data lines, respectively.

In accordance with another aspect of the present invention, there is provided a method of exposing a photosensitive layer of a substrate wherein light is emitted from a source, the light is guided to the substrate via a reticle such that the light picks up an image of the pattern of the reticle, a slit-shaped aperture is formed electronically without the use of motive power in an optical path extending between the light source and the reticle, and an area of the substrate is scanned with the light that has passed through the slit-shaped aperture and the reticle.

The width of the slit-shaped aperture is increased as the scanning of the area of the substrate is initiated, and decreased as the scanning of the area of the substrate is completed. In the case of a die of a semiconductor wafer, for example, the die is scanned for exposure by simultaneously moving the reticle and the substrate parallel to one another in opposite directions.

Preferably, the slit-shaped aperture is formed by driving a liquid crystal display. In this case, scan and data signals are output to orthogonal scan and data lines of the liquid crystal display, respectively. In particular, the data signals may be constantly output to respective ones of the data lines during the scan to maintain the length of the slit-shaped aperture constant. On the other hand, the scan signals are selectively output to respective ones of the scan lines to alter the width of the slit-shaped aperture during the scan.

BRIEF DESCRIPTION OF THE DRAWINGS

The above and other features and advantages of the present invention will become more apparent to those of ordinary skill in the art by referring to the following detailed description of the preferred embodiments thereof made with reference to the attached drawings in which.

DETAILED DESCRIPTION OF THE PREFERRED EMBODIMENTS

Figure 1:
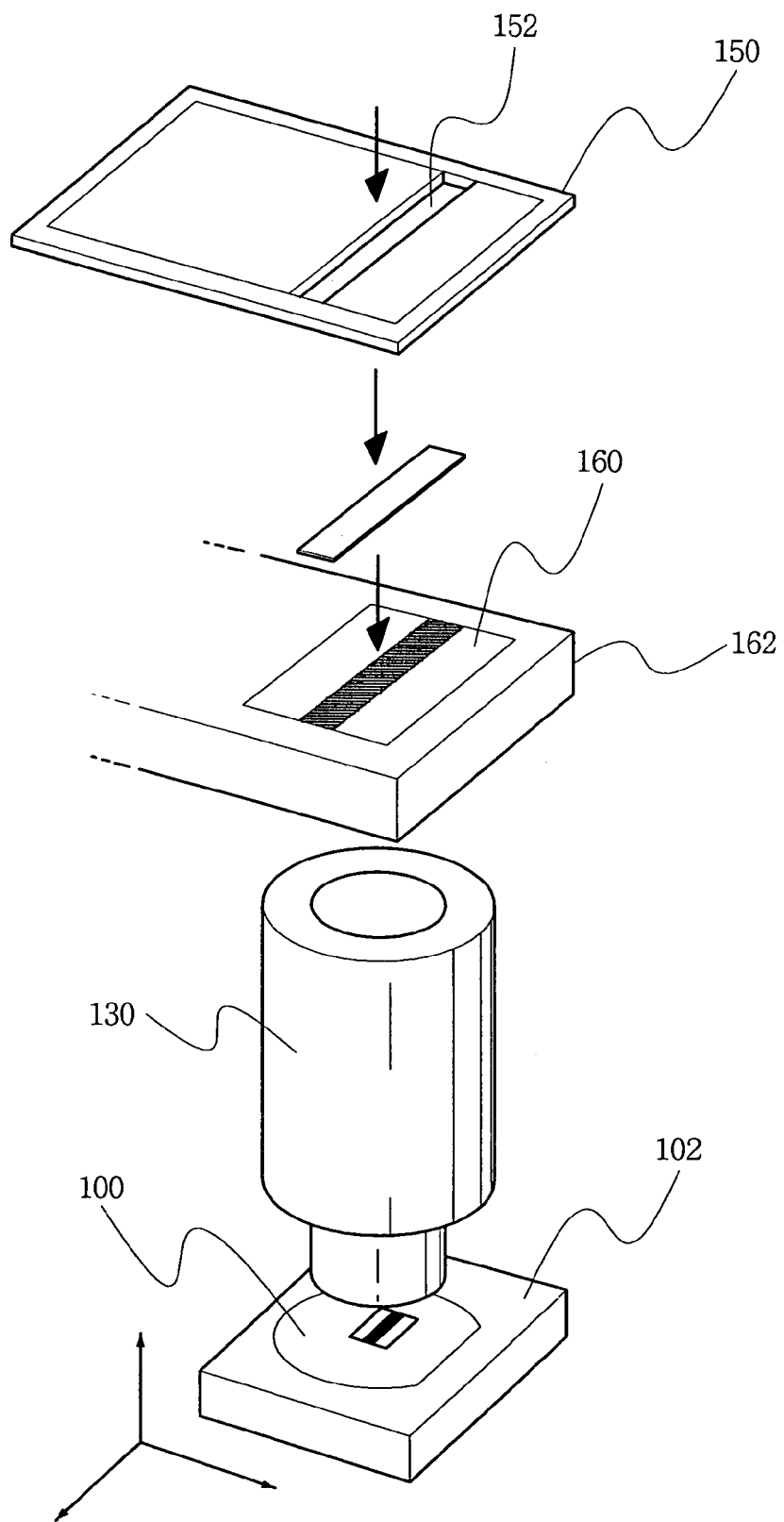
FIG. 1 is a schematic diagram, in perspective, of essential components making up a scanner according to the present invention.

As shown in FIG. 1, the scanner according to the present invention includes a wafer stage 102 for supporting a wafer 100 having a photosensitive layer thereon, a reticle stage 162 for supporting a reticle 160 having a pattern to be transferred to the wafer 100 such that the photosensitive layer is exposed, optics 130 for projecting exposure light onto the wafer 100 supported on the wafer stage 102, and a reticle masking device 150.

The reticle masking device 150 defines a slit-shaped aperture 152 (hereinafter referred to merely as a "slit") for selectively casting exposure light onto the reticle 160. As will be described in more detail below, the reticle masking device 150 forms the slit in an electronic manner, i.e., without the use of mechanically power-driven elements. Accordingly, the slit 152 is formed without vibrations being produced and transmitted throughout the scanner.

In operation, the reticle stage 162 is moved in one direction to move the reticle 160 from one side of the scanner to the other, while the wafer stage 102 supporting the wafer 100 is moved in a direction opposite and hence, parallel to the direction of movement of the reticle stage 162. Furthermore, at this time, the slit formed by the reticle masking device 150 is preferably rectangular. The slit 152 is oriented so that the length of the slit 152 extends in a direction orthogonal to the direction of movement of the reticle 160, and the width of the slit extends parallel to the direction of movement of the reticle 160. Accordingly, the width of the slit 160 corresponds to the dose of the light that will expose the photosensitive layer on the wafer 100.

Furthermore, the forming of the slit 152 is controlled so as to prevent the exposure light from being concentrated at the start and end of an exposure process, as well as to prevent regions other than the reticle 160 or an active region of the reticle stage 162 from being exposed. For this reason, the slit 152 is gradually opened at the start of a scan of the reticle 160, and is gradually closed at the end point of a scan. Regardless, at this time, the reticle masking device 150 of the scanner according to the present invention does not produce vibrations as the area, i.e., the width, of the slit 152 is changed.

In this respect, the reticle masking device 150 comprises a liquid crystal display (LCD) for forming the slit 152 in response to an electric signal, and changing the width of the slit in a direction parallel to the direction of movement of the reticle stage 162 without producing vibrations. In this case, the light source of the scanner may be the back light of a typical LCD. However, the color filters of a typical LCD do not have to be provided.

The LCD can be a passive matrix LCD or an active matrix LCD. Passive matrix LCDs were the first of the two types of LCDs to be researched and developed. Passive matrix LCDs include twisted nematic (TN) LCDs and super twisted nematic (STN) LCDs as classified based on the type of liquid crystal employed. Active matrix LCDs employ thin film transistors as active elements and are thus also referred to as (TFT) LCDs. (TFT) LCDs have a plurality of pixels that are independently driven.

Both passive and active matrix LCDs have opposed substrates, liquid crystals sandwiched between the substrates and whose orientation can controlled by an electric field, and polarizers on both sides of the substrates and whose axes of polarization are orthogonal to each other. Each liquid crystal is of a material (molecule) existing in an intermediate state between that of a liquid and a crystalline solid. Examples of liquid crystals are TN liquid crystals, STN liquid crystals, ferro-electric liquid crystals, or cholesteric liquid crystals. The orientation (of the long axis) of the liquid crystals can be changed by applying an electric field to the liquid crystals. Also, the plane of polarization of the light transmitted through the structure constituted by the substrates and liquid crystals is determined based on the orientation of the liquid crystals. The polarizer at the exit of the LCD can intercept or transmit the light depending on the orientation of the plane of polarization of the light relative to the orientation of the axis of polarization of the polarizer. Thus, the orientation of the liquid crystals can be left as is or changed such that the LCD selectively transmits or absorbs incident light.

Figure 2:
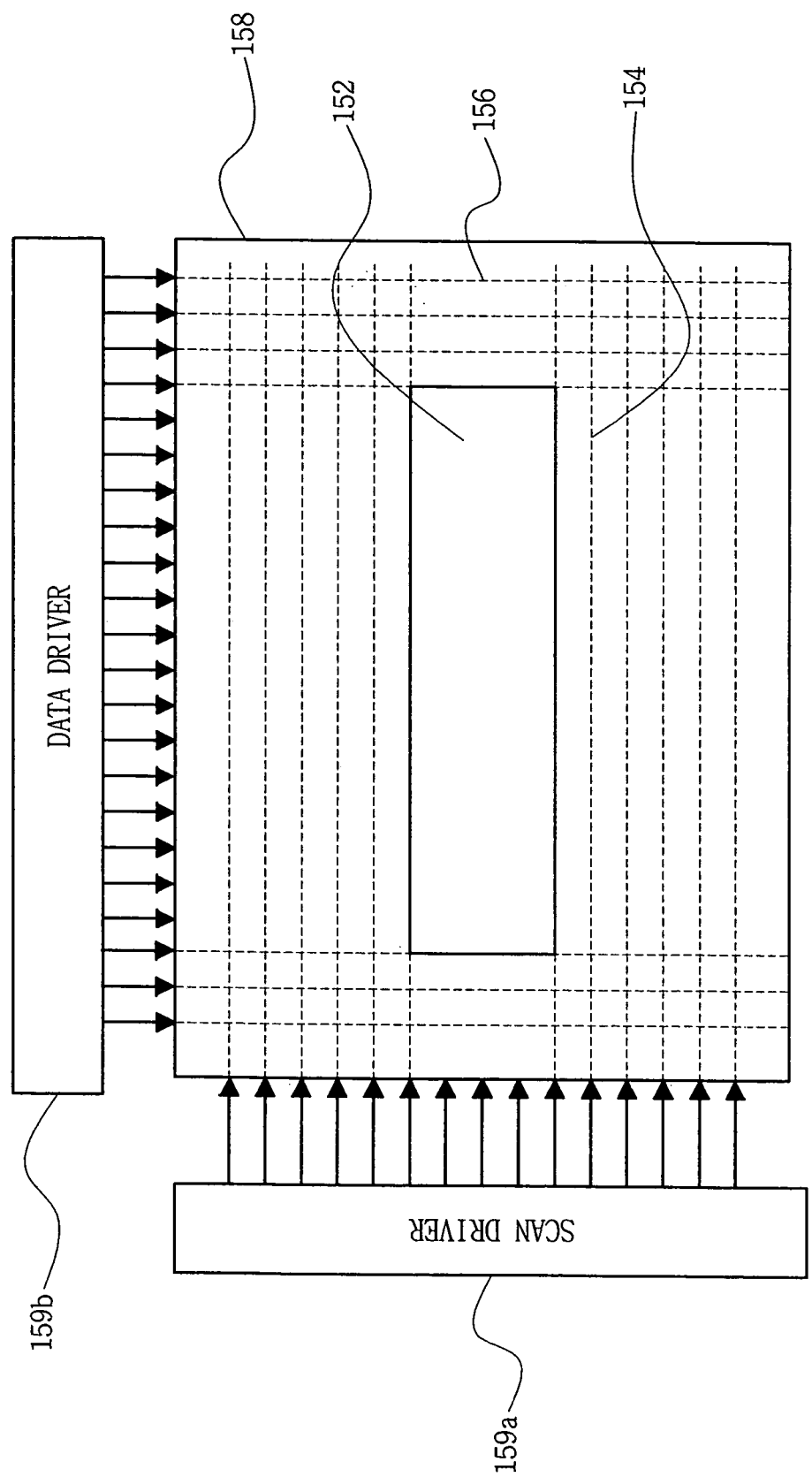
FIG. 2 is a schematic plan view of a reticle masking device of the scanner shown in FIG. 1.

In the LCD constituting the reticle masking device 150 according to the present invention, scan and data lines are formed on the respective substrates as will be described in more detail later on with reference to FIG. 2. The orientation of the liquid crystals can be changed by an electric field induced by voltages impressed across the scan and data lines. However, large voltage differences at pixels may cause distortions in the electric field in the case of a passive matrix LCD. However, only the scan lines projected across the width of the rectangular slit 152 (dimension in the direction parallel to the direction of movement of the reticle stage 162) may be driven so that the electric field is free of distortion at the sides of the rectangular slit 152 that set the width of the slit. That is, the passive matrix LCD can form a rectangular slit having a precise width.

In contrast, in the active matrix LCD, the scan and data lines are formed on the substrates, respectively, so as to be isolated from each other. The active LCD also has TFTs and pixel electrodes disposed on one of the substrates. A respective one of the TFTs, to which a data signal is selectively applied through a scan line, is formed at each location where the scan and data lines cross paths. The active LCD also comprises common electrodes disposed on the other substrate. A ground voltage is applied to the common electrodes. The ground voltage along with a data voltage applied to the pixel electrodes through the TFTs generates the electric field for controlling the orientation of the liquid crystals.

Furthermore, the pixel and common electrodes are transparent electrodes of indium tin oxide (ITO), and the scan and data lines are also transparent. Each TFT includes a translucent conductive layer, such as a polysilicon layer, and an insulating layer that isolates the translucent conductive layer. The translucent conductive layer forms a depletion region of the TFT. The rectangular slit 152 formed by the active matrix LCD must be longer than the rectangular slit formed when a corresponding passive matrix LCD is used as the reticle masking device 150, so as to compensate for the light lost by the TFT. Otherwise, when the active matrix LCD is used the reticle stage 162 and wafer stage 102 must be moved at speeds less than those at which the reticle stage 162 and wafer stage 102 are moved when the passive matrix LCD is used. Accordingly, the passive matrix LCD is preferably used as the reticle masking device 150.

The LCD constituting the reticle masking device 150 according to the present invention will now be described further with reference to FIG. 2. As mentioned above, the LCD can be either an active matrix LCD or a passive matrix LCD. The LCD includes a liquid crystal panel 158 comprising the aforementioned opposing substrates, liquid crystals interposed between the substrates, and polarizers. Also, scan and data lines 154 and 156 are arranged perpendicular to each other on the opposing substrates. The scan lines 154 extend parallel to the lengthwise direction of the slit 152 and so are spaced from one another in the widthwise direction of the slit 152. On the other hand, the data lines 156 extend parallel to the widthwise direction of the slit 152 and so are spaced from one another in the lengthwise direction of the slit 152. The LCD also includes scan and data drivers 159a and 159b that output scan and data signals to the scan and data lines 154 and 156, respectively.

More specifically, the scan driver 159a outputs scan signals to the scan lines 154 to establish the width of the slit 152 through which the exposure light passes onto the reticle 160. On the other hand, the data driver 159b outputs data signals to the data lines 156 to establish the length of the slit 152. In this respect, the scan driver 159a can vary the number of scan lines 154 to which scan signals are transmitted, respectively, to form slits 152 of various widths, i.e., the scan driver 159a can change the width of the slit 152. On the other hand, the data driver 159b applies constant data signals to the data lines 156 so that the length of the slit 152 remains constant. Thus, the liquid crystal panel 158 serves as a slit former, whereas the scan and data drivers 159a and 159b serve as slit formation controllers.

Although not shown, each LCD further includes a timing controller for generating a control signal and a signal voltage to produce the scan and data signals output by the scan and data drivers 159a and 159b, a power supply for generating and supplying power to the timing controller and various power voltages including those applied to the common electrodes, a gamma reference voltage generator for generating a reference voltage using power supplied from the power supply, and a DC-DC converter for supplying an output voltage and at least one constant voltage to the gamma reference voltage generator.

Figure 3:
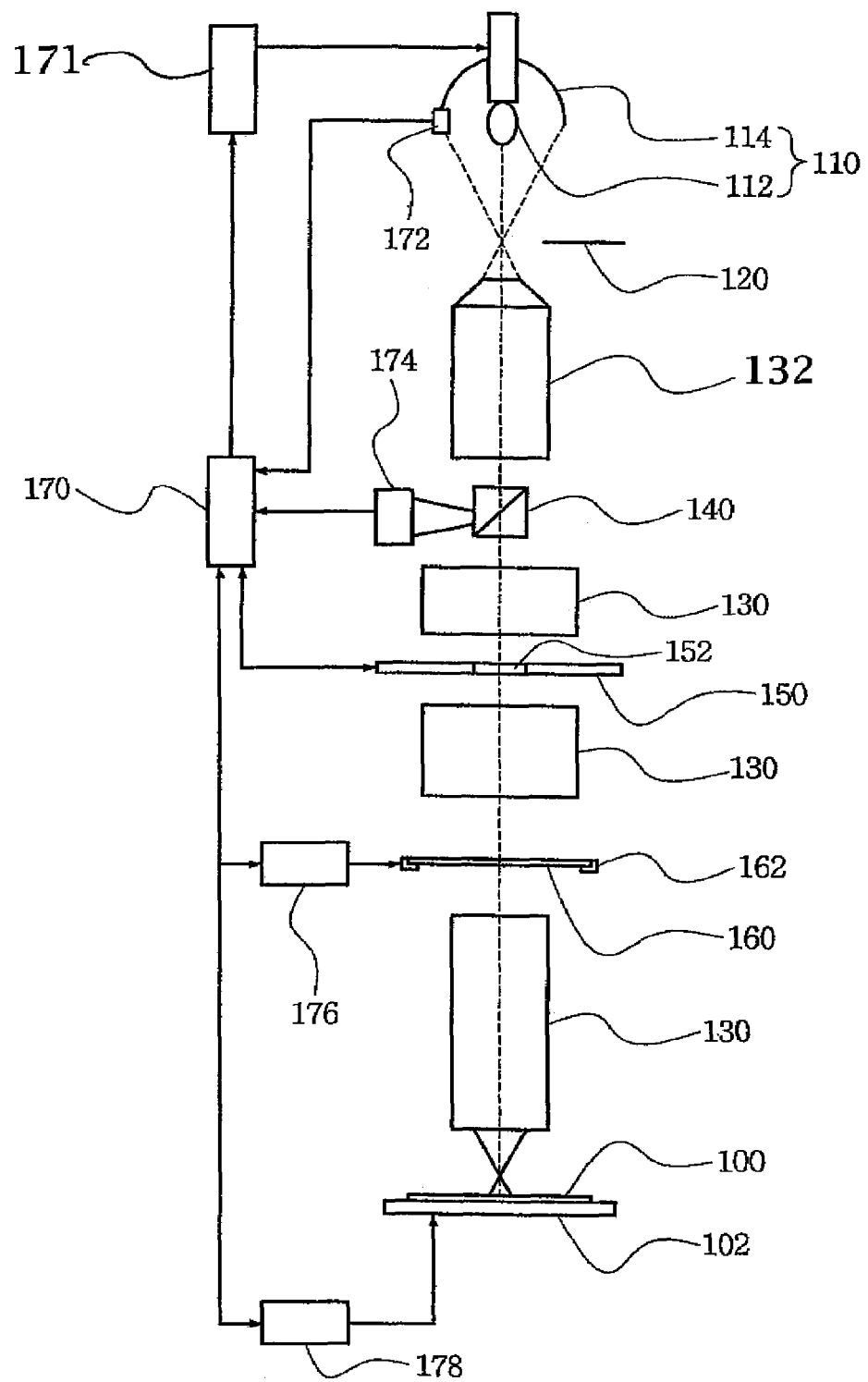
FIG. 3 is a schematic diagram of a scanner according to the present invention.

FIG. 3 illustrates another scanner according to the present invention. Elements that are similar to those shown in and previously described with reference to FIG. 1 are designated by like reference numerals. Referring to FIG. 3, the scanner includes a light source 110 comprising a lamp 112 for generating exposure light, and a condenser cover 114 for condensing the light generated by the lamp 112. The lamp 112 may comprise an i-line laser (365 nm), a KrF excimer laser (248 nm), an ArF excimer laser (193 nm), or a fluoride dimmer ($F_2$ laser, 157 nm). Alternatively, the lamp 122 may comprise an extreme ultraviolet laser (EUV, 13 nm).

The lamp 112 may also be adjustable so that the intensity of light generated by the lamp 112 can be changed. To this end, a variable power supply 171 is connected to the lamp 112 for adjusting the voltage applied to the lamp 112. In addition, a light source controller or exposure controller 170 is connected to the variable power supply 171. A first photo sensor 172 is provided at the periphery of the condenser cover 114 to sense the intensity of light generated by the lamp 112 and output a signal representative of the intensity to the light source controller or exposure controller 170. The controller 170, in turn, generates a control signal for controlling the output of the power supply 171 based on the feedback received from the first photo sensor 172.

The scanner also includes a shield 120, such as a shutter, to selectively allow the light generated by the light source 110 to be incident on the reticle 160. The shutter allows the exposure of the wafer 100 to be terminated at precisely the desired time.

The optics 130 of the scanner guide the light generated by the light source 110 through the reticle 160 and onto the wafer 100. To this end, the optics 130 may include one or more optical components disposed along the optical path between the light source 110 and the reticle stage 162 and between the reticle stage 162 and the wafer stage 102. For example, the optical components include an optic tube, a convex lens, a concave lens or a reflector. The optical components are ideally of quartz or glass such that the light propagating from the light source 100 to wafer 100 via the reticle 160 does not experience any significant loss.

The optics 130 also includes an illumination system 132 disposed to the side of the shield 120 opposite the light source 110. The illumination system 132 diffracts the light generated by the light source 110 to obtain $0^{th}$ and $\pm 1^{st}$ order diffracted light, and selectively extracts light of a high directionality from the diffracted light. The illumination system 132 may be a conventional on axis illumination system in which the extracted light propagates along an optical axis coincident with that of the light source 110 or an off-axis illumination system in which the extracted light propagates along an axis/axes laterally offset from the optical axis of the light source 110. To this end, the off-axis illumination system may include an annular aperture, a dipole aperture, or a quadrupole aperture wherein one or more apertures are disposed symmetrically about the optical axis of the light source 110. In general, an off-axis illumination system provides a higher resolution and better depth of focus (DOF) than an on-axis illumination system.

However, the extracting of light by the illumination system 132 can entail a great deal of loss. Therefore, the intensity of the light should be checked while the light propagates from the illumination system 132 to the reticle masking device 150 through the optics 130. To this end, part of the light propagating to the reticle masking device 150 is extracted by a light splitting means 140, such as a beam splitter, interposed between the illumination system and an optical component of the optics 130. The light extracted by the light splitting means 140 is supplied to and sensed by a second photo sensor 174. Accordingly, the intensity of light propagating to the reticle masking device 150 can be detected. That is, the second photo sensor 174 outputs a signal representative of the light extracted by the light splitting means 140 to the exposure controller 170, and based on this signal the exposure controller 170 determines the intensity of light emitted from the light source 110 and transmitted from the illumination system 132.

Furthermore, the light splitting means 140 can be characterized by the ratio of light reflected (onto the second photo sensor 174) to the light transmitted (to the reticle masking device 150). A value representative of this characteristic is input to the exposure controller 170 and thereby employed in determining the intensity of light emitted from the light source 110. The exposure controller 170 controls the power source 171 to adjust the intensity of light emitted from the light source 110, if necessary.

The light whose intensity is controlled in the manner described above is incident on the reticle masking device 150. At this time, the reticle masking device 150 defines a slit, such as a rectangular slit 152, so that the light incident on the reticle 160 has a maximum dimension that is approximately the same as the diameter of the smallest aperture of the optics 130, e.g., the diameter of the pupil of the objective lens. (The objective lens is the optical component that reduces the scale of the image of the reticle pattern and projects the reduced image onto the wafer 100). At this time, the reticle 160 and wafer 100 are moved in opposite directions such that the reticle 160 and wafer 100 are scanned with the light passing through the reticle masking device 150. For example, the reticle stage 162 and wafer stage 102 are supported by linear motion (LM) guides and are moved in opposite directions along their respective guides each by a stepping motor (not shown) under the command of first and second servo controllers 176 and 178, respectively. The servo controllers 176 and 178 are operatively connected to and controlled by the exposure controller 170.

At this time, the reticle stage 162 and wafer stage 102 should be moved by a distance corresponding to the length of a die of the wafer 100. As is known in the art, the die corresponds to an area onto which image the reticle pattern is to be transcribed, and the transcribing of such a pattern is repeated for several dies defined over the surface of the wafer 100.

However, the operation of the stepping motor in moving the reticle stage 162 or the wafer stage 102 produces vibrations. Such vibrations have the potential to prevent the reticle 160 from being aligned exactly with the wafer 100, i.e., can reduce the quality of the exposure process. A relative position error (misalignment between the wafer and the reticle) caused by the shaking of the reticle stage 162 and wafer stage 102 is represented by Equation 1.

$$e = e_{WS} - e_{RS}/4 \qquad \text{[Equation 1]}$$

wherein e is the relative position error, $e_{WS}$ is an error corresponding to the difference between the real time position of the wafer stage 102 and its fixed position when not vibrating, and $e_{RS}$ is an error corresponding to the difference between the real time position of the reticle stage 162 and its fixed position when not vibrating. In this case, a factor of "¼" is applied to $e_{RS}$. This is because the image of the pattern of the reticle 160 is reduced by a factor of four when projected onto the wafer 100. Also, the errors $e_{WS}$ and $e_{RS}$ can be expressed as functions of time and position as determined using vibration sensors (not shown) for sensing the vibration of each stage (or the reticle stage and the wafer 100) during the exposure process.

The scanner according to the present invention can compensate for the error caused by the vibration of the reticle stage 162 and wafer stage 102 because such an error can be isolated and thus precisely determined as described above. On the other hand, the reticle masking device 150 forms the slit 152 electronically, i.e., without the use of a motive power, so that no vibrations are produced in the forming of the slit 152. Therefore, it is relatively easy to precisely determine the relative position error due to vibrations, and compensate for such an error. Accordingly, the exposure process can be carried out with a high degree of precision, whereby a high quality semiconductor device or the like can be produced. This advantage of the present invention will be described in more detail with reference to FIG. 4.

Figure 4:
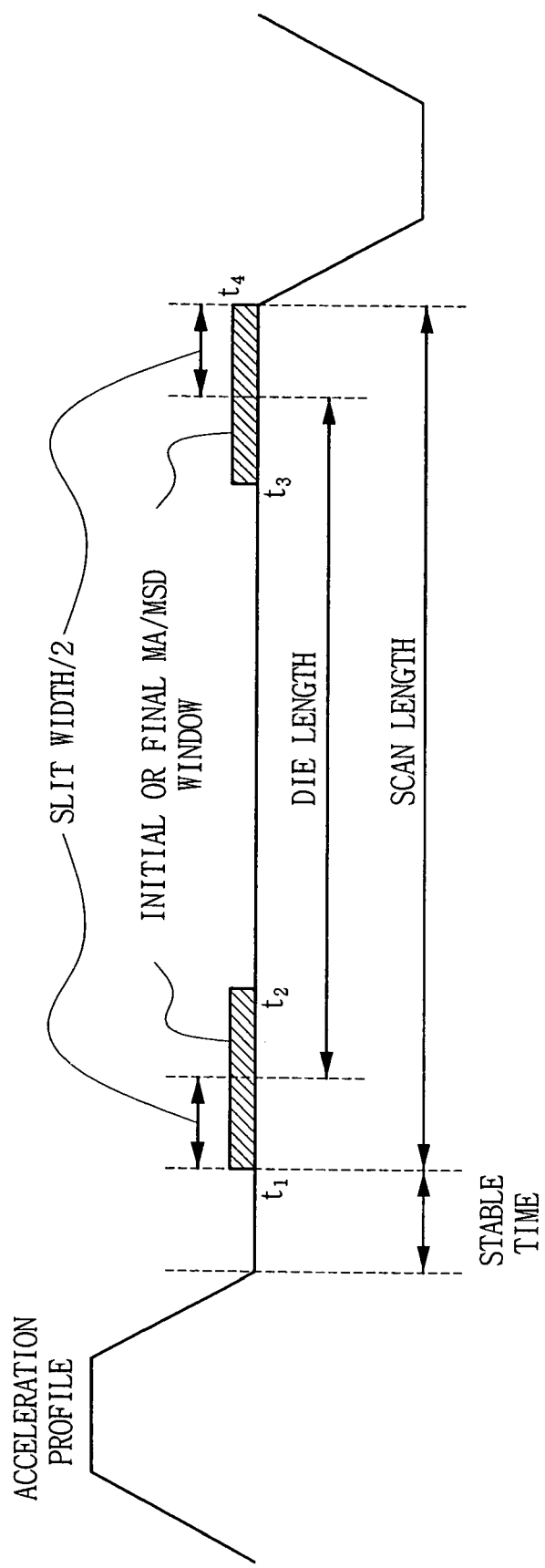
FIG. 4 is an explanatory diagram of the acceleration profile of a reticle stage or wafer stage during an exposure process.

FIG. 4 is a graph of the acceleration profile of a reticle stage 162 or wafer stage 102 during an exposure process, i.e., during a scan of a die. In FIG. 4, t1 is the time at which the slit 152 begins to be formed as the scan is initiated, t2 is the time at which the slit 152 is completely formed once the scan has been initiated, t3 is the time at which the slit 152 begins to be closed (narrowed) as the scan is terminated, and t4 is the time at which the slit 152 is no longer present (has been completely closed) once the scan is terminated. The reticle stage 162 and the wafer stage 102 are each moved over a distance (scan length) according to the length of the die, and the width of the slit 152. Specifically, the scan length is the sum of the length of the die (dimension of the die in the direction of scan) and values corresponding to the width of the slit 152 at time (t2−t1)/2 and at time (t4−t3)/2, respectively.

As is shown in FIG. 4, the reticle stage 162 and wafer stage 102 are each moved at a constant speed after their initial acceleration so as to minimize a relative position error due to vibrations. However, during this time, the slit 152 is opened (widened) and closed (narrowed) which in the case of a conventional reticle masking device would produce vibrations in the reticle stage and wafer stage in addition to the reticle masking device. In this case, the vibration of the reticle masking device would have to be factored into the calculation of the relative position error. A relatively complicated numerical formula would have to be derived to calculate such an error.

In contrast to a scanner employing the conventional reticle masking device, the scanner according to the present invention can ideally calculate the error caused by vibrations generated during the transfer of the reticle stage 162 and wafer stage 102 because the error is not compounded by vibrations of the reticle masking device 150. Specifically, the width of slit 152 is altered electronically so that no vibrations are produced.

Furthermore, the average position of the stage at a time at which a specific point of the die is within the field of the slit 152 can be determined based on a shift in the specific point (overlay) on the die. At this time, the shift of all points X on the die can be expressed as a moving average error (hereinafter, referred to as "MA"), as represented in Equation 2.

$$MA = \frac{1}{T_{\exp}} \int_{t_x - T_{\exp}/2}^{t_x + T_{\exp}/2} e(t)\,dt \qquad \text{[Equation 2]}$$

wherein $T_{exp}$ is the exposure time corresponding to the width of the slit 152 divided by a scan speed, i.e. the slit's width/$_{scan}$, e(t) is the relative position error as a function of time for the wafer stage 102 and reticle stage 162, and $t_x$ is the time at which the point X is located at the center of the lens. Thus, the MA is obtained by summing up the relative position errors while the wafer and reticle stages 102 and 162 are moved in correspondence with the die length, and dividing the summed results by the exposure time.

The MA is mitigated when the reticle and wafer stages 162 and 102 are vibrating in opposite directions, but may manifest itself as a loss in image sharpness or contrast when the reticle and wafer stages 162 and 102 are vibrating in the same directions. In the latter case, a moving standard deviation (MSD) corresponding to the standard deviation between relative position errors when the exposure is performed can be expressed as shown in Equation 3.

$$MSD(x) = \sqrt{\frac{1}{T_{\exp}} \int_{t_x - T_{\exp}/2}^{t_x + T_{\exp}/2} [e(t) - MA(x)]^2\,dt} \qquad \text{[Equation 3]}$$

Equation 3 shows that the MA is lowest when the reticle and wafer stages 162 and 102 are vibrating in opposite directions but the MSD is high. Ideal peaks of the MA and MSD values are calculated by the exposure controller 170. The exposure controller 170 controls the first and second servo controllers 176 and 178 on the basis of these values, i.e., controls the displacement of the reticle stage 162 or wafer stage 102 during the exposure process (scan).

Figure 5A:
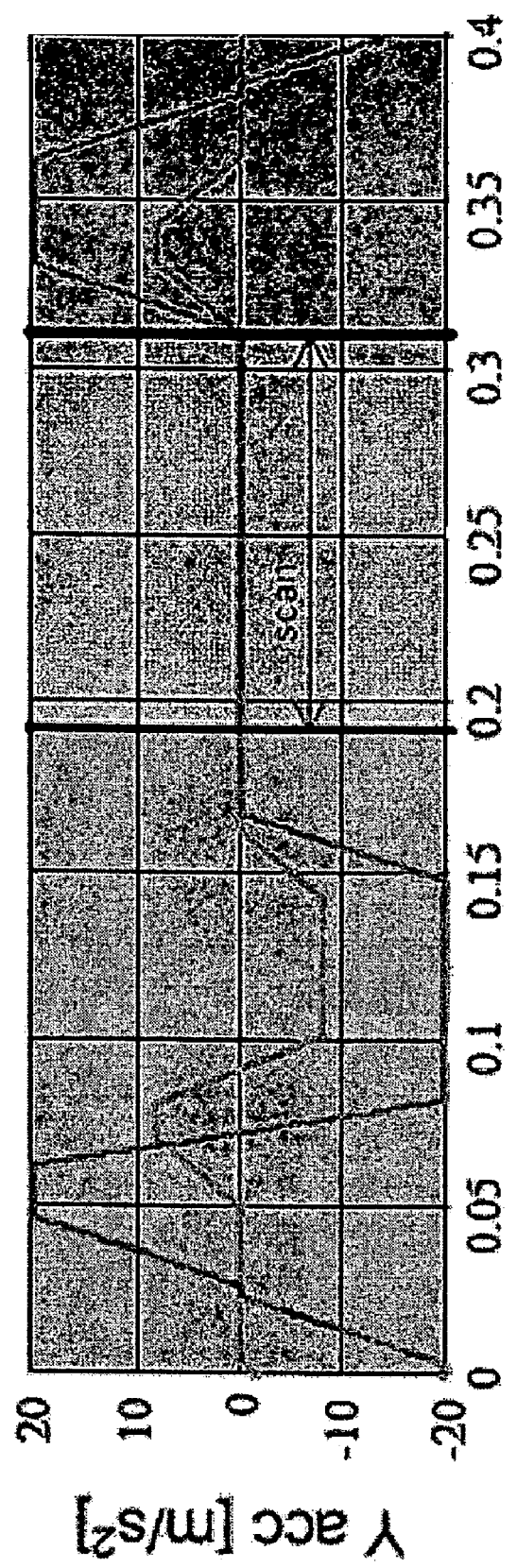
FIG. 5A is a graph of an acceleration profile of a wafer stage and a reticle stage of a scanner.
Figure 5E:
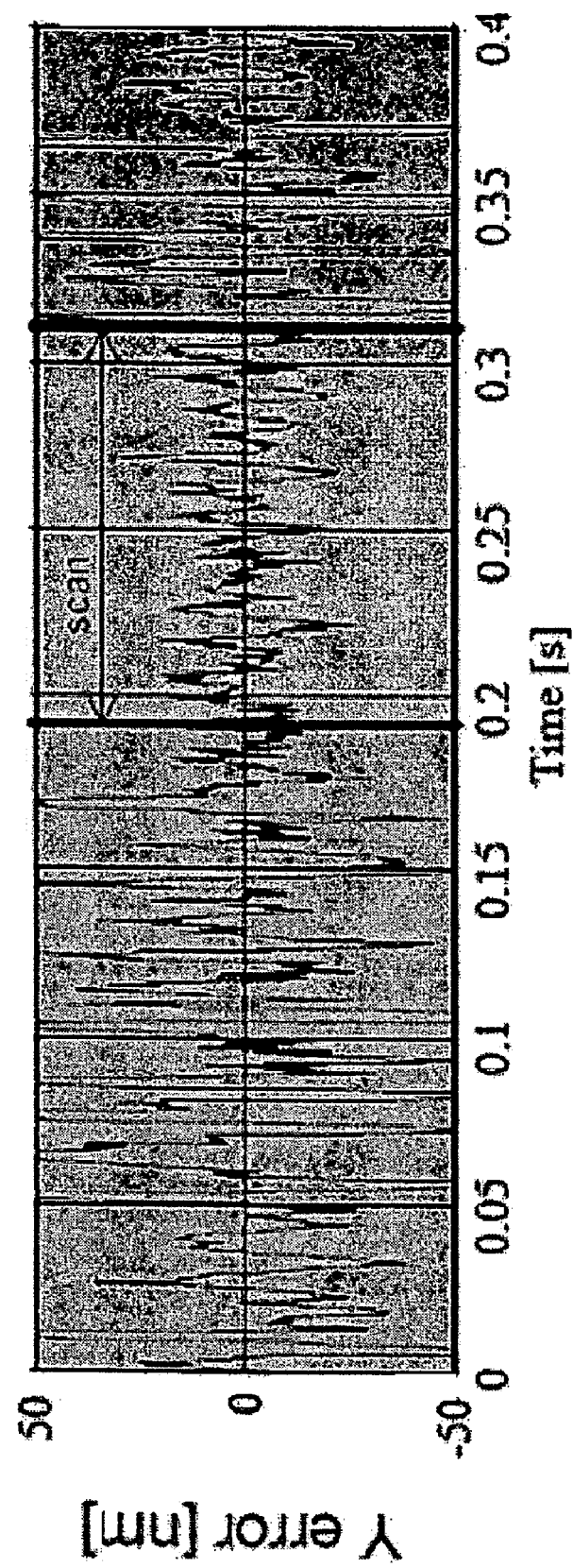
FIG. 5B is a graph of relative position errors of a wafer stage and a reticle stage of the scanner as a function of time.
FIG. 5C is a graph of moving average errors MA of the scanner calculated based on the acceleration profile and relative position errors shown in FIGS. 5A and 5B.
FIG. 5D is a graph of a moving standard deviation MSD of the MA calculated based on the acceleration profile and relative position errors shown in FIGS. 5A and 5B.
Figure 5C:
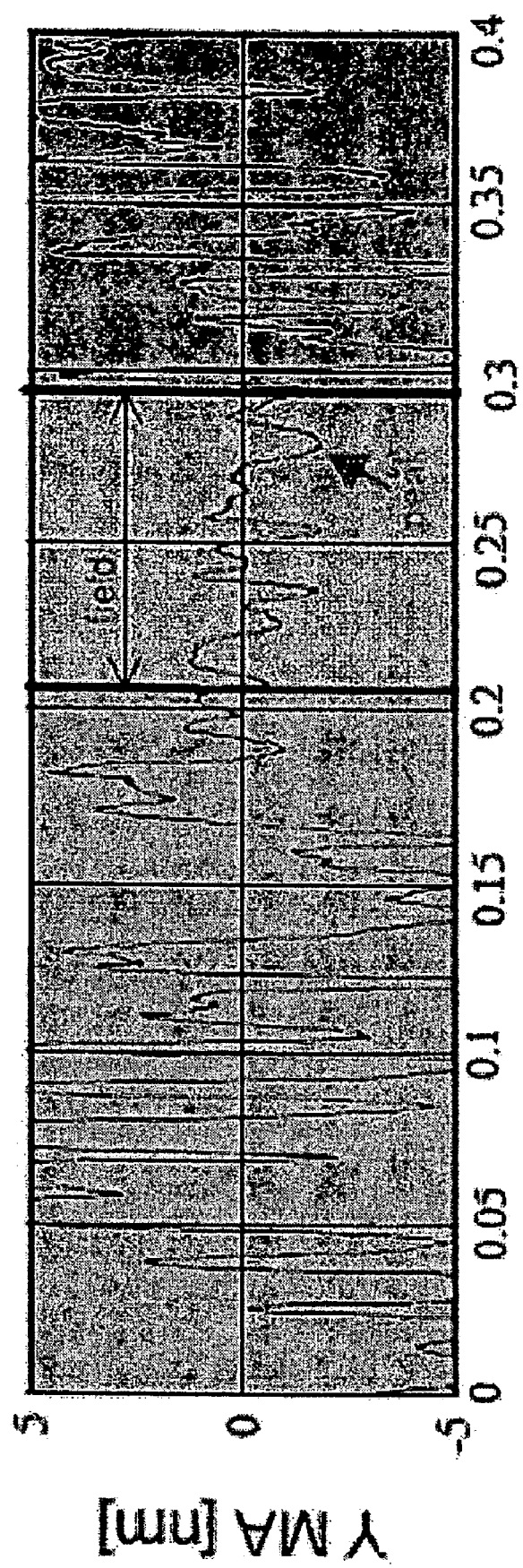
Figure 5D:
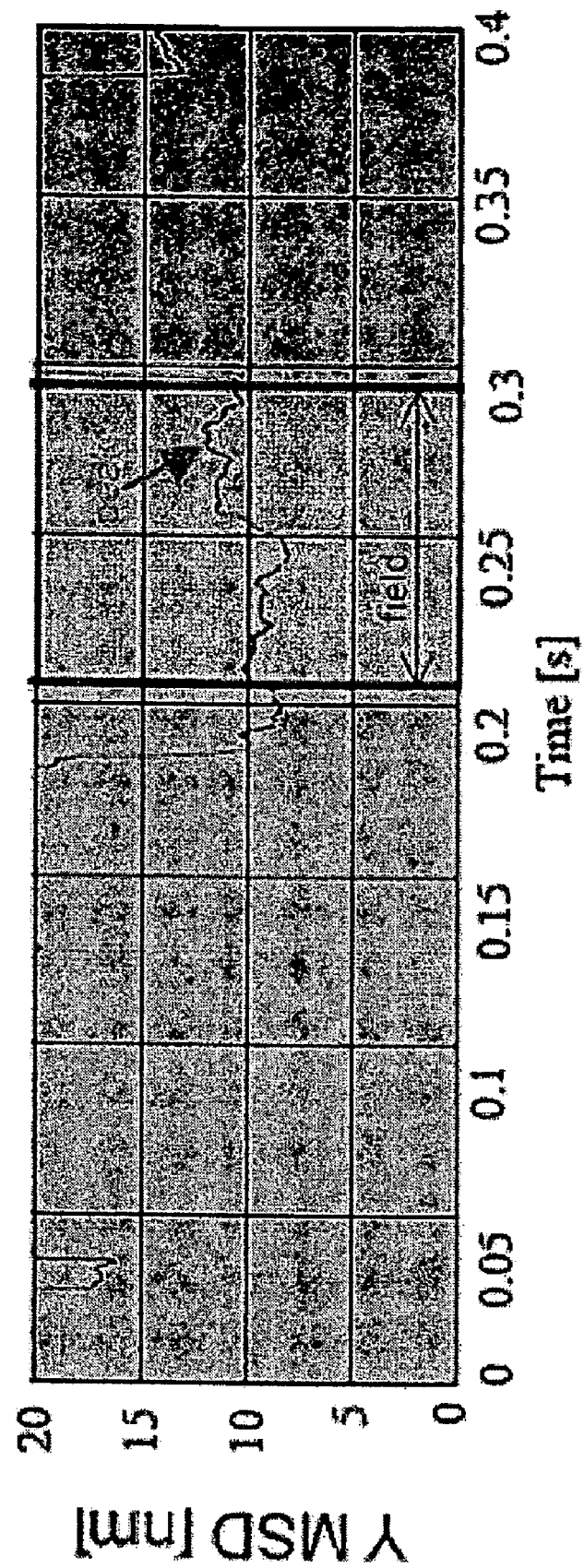

FIGS. 5A and 5B are graphs of an acceleration profile and relative position error over time during the movement of a wafer stage 102 and a reticle stage 162 and, in particular, while a die is being scanned. FIGS. 5C and 5D are graphs of the MA and MSD calculated based on the profile and relative position error shown in FIGS. 5A and 5B. In FIG. 5A, the portion of the graph between the two dark vertical lines shows a scan in which the reticle stage 162 and wafer stage 102 are moved at a fixed speed. Likewise, the portion of the graph between the two dark vertical lines in FIG. 5B shows the relative position error caused by vibrations generated during the scanning. Similarly, the portions of the graphs between the dark vertical lines in FIGS. 5C and 5D show fields for calculating the MA and MSD during the scan, respectively.

As shown in FIGS. 5A to 5D, the MA and MSD peaks are about 2.1 nm and 12.3 nm, respectively while the reticle and wafer stages 162 and 102 are scanning a die.

The scan speed, though, has a direct relation to the MA value. In particular, the MA improves almost in direct proportion to decreases in the speeds at which the reticle stage 162 and the wafer stage 102 are moved during a scan. However, lowering the speeds at which the reticle and wafer stages 162 and 102 are moved to improve the MA increases the time it takes to expose a die (the exposure time). Thus, the productivity of the lithographic process is lowered. For this reason, the speeds at which the reticle and wafer stages 162 and 102 are moved during a scan should be maintained as high as possible. Accordingly, vibrations of an appreciable magnitude will be generated due to the mechanical elements associated with the movement of the wafer stage 102 and reticle stage 162.

On the other hand, the reticle masking device 150 comprises an LCD which is capable of forming the slit 152 in an electronic manner, i.e., without the use of motive power-driven elements, during the exposure process. Therefore, the scanner precisely calculates the relative position errors caused by the vibrations generated during the movement of the reticle or wafer stage 162 or 102. These calculations can be used as feedback to control the exposure process. Accordingly, the scanner according to the present invention can prevent flaws in the exposure process, and thereby maximize the production yield of the lithographic process.

Finally, although the present invention has been described above in connection with the preferred embodiments, such a description is merely illustrative of the invention. For example, devices other than an LCD but capable of also electronically forming a slit-shaped aperture may be used as the reticle masking device 150. Thus, modifications of and changes to the preferred embodiments are seen to be within the true spirit and scope of the invention as defined by the appended claims.

What is claimed is:

1. A scanner of lithographic equipment, comprising:
   a light source that emits exposure light;
   a substrate stage dedicated to support a substrate having a photosensitive layer to be exposed by the exposure light, the substrate stage supported in the equipment so as to be movable horizontally in a scan direction, whereby a substrate supported on the stage can be moved horizontally;
   optics that guide the light emitted by the light source to the substrate stage;
   a reticle stage dedicated to support a reticle, the reticle stage disposed in an optical path of the equipment extending between the light source and the substrate stage such that light emitted by the light source will pass through a reticle supported by the reticle stage, whereby the light will pick up an image of a pattern of the reticle, and the reticle stage being supported in the equipment so as to be movable horizontally in a scan direction parallel to the scan direction of movement of the substrate stage, whereby a reticle supported by the reticle stage can be moved parallel to the movement of the substrate stage; and
   reticle masking means for forming a slit-shaped aperture electronically without the use of motive power in an optical path of the equipment extending between the light source and the reticle stage such that light having a sectional area corresponding to that of the aperture is incident on a reticle supported by the reticle stage, and for adjusting a dimension of the aperture electronically without the use of motive power, whereby the reticle scanning means can form the aperture and adjust said dimension of the aperture without inducing vibrations in the scanner.

2. A scanner of lithographic equipment, comprising:

a light source that emits exposure light;

a substrate stage dedicated to support a substrate having a photosensitive layer to be exposed by the exposure light, the substrate stage supported in the equipment so as to be movable horizontally in a scan direction, whereby a substrate supported on the stage can be moved horizontally;

optics that guide the light emitted by the light source to the substrate stage;

a reticle stage dedicated to support a reticle, the reticle stage disposed in an optical path of the equipment extending between the light source and the substrate stage such that light emitted by the light source will pass through a reticle supported by the reticle stage, whereby the light will pick up an image of a pattern of the reticle, and the reticle stage being supported in the equipment so as to be movable horizontally in a scan direction parallel to the scan direction of movement of the substrate stage, whereby a reticle supported by the reticle stage can be moved parallel to the movement of the substrate stage; and a liquid crystal display disposed in an optical path of the equipment extending between the light source and the reticle stage, whereby the operation of the liquid crystal display does not induce vibrations in the scanner.

3. The scanner according to claim 2, wherein the liquid crystal display includes a liquid crystal panel comprising opposing substrates having scan and data lines extending orthogonal to each other and liquid crystals interposed between the substrates, and scan and data drivers that selectively output scan and data signals to the scan and data lines, respectively, whereby the liquid crystal display is configured to form a slit-like aperture the width of which is adjustable.

4. The scanner according to claim 2, wherein the light source is variable so that the intensity of the light emitted therefrom is adjustable.

5. A method of exposing a photosensitive layer of a substrate, comprising:

emitting light from a source;

guiding the light to the substrate having the photosensitive layer via a reticle having a pattern, whereby the light picks up an image of the pattern of the reticle;

forming a slit-shaped aperture electronically without the use of motive power in an optical path extending between the light source and the reticle such that the light emitted from the light source and cast on the reticle has a cross-sectional shape corresponding to that of the slit-shaped aperture; and scanning an area of the substrate with the light that has passed through the slit-shaped aperture and the reticle.

6. The method according to claim 5, wherein the forming of the slit-shaped aperture comprises increasing the width of the slit-shaped aperture as the scanning of the area of the substrate is initiated, and decreasing the width of the slit-shaped aperture as the scanning of the area of the substrate is completed.

7. The method according to claim 5, wherein the area scanned is a die of a substrate constituting one of several unit areas on the substrate to be scanned, and the scanning of the die comprises simultaneously moving the reticle and the substrate parallel to one another in opposite directions.

8. The method according to claim 7, wherein the forming of the slit-shaped aperture comprises increasing the width of the slit-shaped aperture as the scanning of the die is initiated, and decreasing the width of the slit-shaped aperture as the scanning of the die is completed.

9. The method according to claim 5, wherein the forming of the slit-shaped aperture comprises driving a liquid crystal display.

10. The method according to claim 9, wherein the forming of the slit-shaped aperture comprises outputting scan and data signals to scan and data lines of the liquid crystal display, respectively, which scan and data lines extend orthogonally to one another.

11. The method according to claim 10, wherein the data signals are only constantly output to respective ones of the data lines during the scanning of the area of the substrate to maintain the length of the slit-shaped aperture constant, and the scan signals are selectively output to respective ones of the scan lines to alter the width of the slit-shaped aperture during the scanning of the area of the substrate to vary the width of the slit-shaped aperture.

* * * * *